United States Patent
Sasaki et al.

(10) Patent No.: US 7,981,785 B2
(45) Date of Patent: *Jul. 19, 2011

(54) METHOD FOR MANUFACTURING SEMICONDUCTOR DEVICE AND PLASMA OXIDATION METHOD

(75) Inventors: Masaru Sasaki, Amagasaki (JP); Yoshiro Kabe, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 870 days.

This patent is subject to a terminal disclaimer.

(21) Appl. No.: 10/591,343

(22) PCT Filed: Mar. 1, 2004

(86) PCT No.: PCT/JP2004/002488
§ 371 (c)(1),
(2), (4) Date: Aug. 31, 2006

(87) PCT Pub. No.: WO2005/083795
PCT Pub. Date: Sep. 9, 2005

(65) Prior Publication Data
US 2007/0224836 A1  Sep. 27, 2007

(51) Int. Cl.
*H01L 27/088* (2006.01)
*H01L 29/768* (2006.01)

(52) U.S. Cl. ....... 438/588; 438/157; 438/283; 438/303; 438/582; 438/585; 438/591; 438/593; 438/595; 438/685; 257/250; 257/315; 257/340; 257/388; 257/412; 257/763; 257/E27.06

(58) Field of Classification Search .................. 438/513, 438/676, 771, 772, 776, 777, 788, 789, 792, 438/793, 157, 176, 195, 267, 283, 585–596, 438/265, 778, 787, 151, 197–199, 257, 287, 438/303, 582, 656, 683, 685, FOR. 198, FOR. 202, 438/FOR. 203, FOR. 352, FOR. 494; 257/E21.176–E21.186, E21.374, E21.458, 257/E21.621–E21.624, E21.635–E21.638, 257/151–153, 249, 314–320, 331, 366, 387, 257/E29.125–E29.131, E29.134–E29.138, 257/E29.14–E29.161, E29.275, E29.319, 257/217, 239, 250, 259, 267, 280, 281, 340, 257/368–369, 388, 406, 411–413, 763–764, 257/E27.06
See application file for complete search history.

(56) References Cited

U.S. PATENT DOCUMENTS 5,368,686 A * 11/1994 Tatsumi et al. ............... 438/696
(Continued)

FOREIGN PATENT DOCUMENTS
EP  0 964 437 A2  12/1999
(Continued)

*Primary Examiner* — Matthew C Landau
*Assistant Examiner* — Maliheh Malek
(74) *Attorney, Agent, or Firm* — Oblon, Spivak, McClelland, Maier & Neustadt, L.L.P.

(57) ABSTRACT

A polysilicon electrode layer (103) (a first electrode layer) is formed by forming a polysilicon film on a gate oxide film (102) on a silicon wafer (101). A tungsten layer (105) (a second electrode layer) is formed on this polysilicon electrode layer (103). In addition, a barrier layer (104) is formed on the polysilicon electrode layer (103) before the formation of the tungsten layer (105). Etching is then conducted using a silicon nitride layer (106) as the etching mask. Next, an oxide insulating film (107) is formed on an exposed surface of the polysilicon layer (103) by plasma oxidation wherein a process gas containing oxygen gas and hydrogen gas is used at a process temperature not less than 300° C. With this method, a selective oxidation of the polysilicon electrode layer (103) can be carried out without oxidizing the tungsten layer (105).

7 Claims, 8 Drawing Sheets

U.S. PATENT DOCUMENTS

| | | | |
|---|---|---|---|
| 5,698,072 A * | 12/1997 | Fukuda | 438/592 |
| 6,001,718 A * | 12/1999 | Katata et al. | 438/592 |
| 6,177,334 B1 * | 1/2001 | Chen et al. | 438/584 |
| 6,323,115 B1 | 11/2001 | Tanabe et al. | |
| 6,699,777 B2 * | 3/2004 | Agarwal | 438/592 |
| 7,049,187 B2 * | 5/2006 | Yamamoto et al. | 438/197 |
| 7,159,599 B2 * | 1/2007 | Verhaverbeke et al. | 134/109 |
| 2001/0020707 A1 * | 9/2001 | Segawa et al. | 257/288 |
| 2002/0004263 A1 | 1/2002 | Tanabe et al. | |
| 2003/0170942 A1 * | 9/2003 | Taguwa | 438/197 |
| 2004/0072446 A1 * | 4/2004 | Liu et al. | 438/719 |
| 2004/0259339 A1 | 12/2004 | Tanabe et al. | |
| 2005/0009281 A1 * | 1/2005 | Lim et al. | 438/287 |
| 2006/0003565 A1 * | 1/2006 | Sasaki | 438/592 |
| 2007/0184618 A1 | 8/2007 | Tanabe et al. | |
| 2008/0032511 A1 * | 2/2008 | Kabe et al. | 438/771 |

FOREIGN PATENT DOCUMENTS

| | | |
|---|---|---|
| JP | 08/102534 | 4/1996 |
| JP | 08 102534 | 4/1996 |
| JP | 11 293470 | 10/1999 |
| JP | 11-330468 | 11/1999 |
| JP | 000-332245 | 11/2000 |
| JP | 2000 332245 | 11/2000 |
| JP | 2002-026317 | 1/2002 |

* cited by examiner

METHOD FOR MANUFACTURING SEMICONDUCTOR DEVICE AND PLASMA OXIDATION METHOD

TECHNICAL FIELD

The present invention relates to a method for manufacturing a semiconductor device by processing a semiconductor substrate by plasma, and a plasma oxidation method.

BACKGROUND ART

In recent years, with the speeding up of transistors and the scale down of devices, a gate oxide film and the like are being made very thin. A gate of the transistor is generally formed in order of a well, a gate insulating film and a gate electrode. After the gate electrode is formed, side surfaces of the gate electrode are subjected to wet etching. Thus, the gate electrode is exposed, so that when a voltage is applied to the gate electrode, electric field concentration occurs at the exposed portion, causing a defect such as an increase in leak current. Therefore, an insulating film is generally formed on the exposed portion of the gate electrode.

Polysilicon is generally used as a gate electrode, but a metal having a low resistance value is laminated on it because the polysilicon has a high sheet resistance. As the metal to be laminated, a refractory metal such as tungsten or its silicide is selected considering workability and adhesiveness to a silicon oxide film and silicon itself. Where an insulating film is formed on side surfaces of the gate electrode exposed by etching, it is general to process by thermal oxidation at a high temperature of 800° C. or more.

But, tungsten is oxidized quickly at about 300° C., so that the resistance value of the tungsten layer increases when the gate electrode is subjected to the thermal oxidation. As a result, the resistance value of the gate electrode is increased. And, the tungsten and the polysilicon react to diffuse tungsten nitride (WN) of a diffusion preventing layer, possibly resulting in increasing a specific resistance.

The thermal oxidation requires a relatively long time. Therefore, it disturbs the improvement of productivity by increasing a throughput.

As a method of forming an oxide film other than the thermal oxidation, there is proposed a method of forming an oxide film by plasma as described in, for example, JP-A 11-293470 (KOKAI). It is a method for forming a silicon oxide film by introducing a silicon-containing gas and an oxygen-containing gas into a treating chamber, generating plasma of the gases, and depositing a silicon oxide film on a substrate, wherein hydrogen gas is introduced into the treating chamber in addition to the silicon-containing gas and the oxygen-containing gas to generate plasma containing hydrogen in the treating chamber. Thus, excellent film quality equal to that of a thermally-oxidized film can be obtained.

For the tungsten, it is desirable to perform processing at 300° C. or less to prevent oxidation, but for formation of an oxide film on silicon, a higher temperature is a preferable condition on the points that excellent film quality can be obtained, an oxidation rate is high, a difference in oxidation rate depending on a pattern density becomes small, and the like.

DISCLOSURE OF THE INVENTION

The present invention provides a method for manufacturing a semiconductor device capable of performing a selective oxidation treatment of a layer of polysilicon or the like at a higher temperature without oxidizing a tungsten or tungsten silicide layer, and a plasma oxidation method.

One aspect of the present invention is a method for manufacturing a prescribed semiconductor device by forming a film mainly formed of tungsten and a film of a component different from the film mainly formed of the tungsten on a semiconductor substrate, comprising forming a first layer, which is formed of the film of the component different from the film mainly formed of the tungsten, on the semiconductor substrate; forming a second layer, which is formed of the film mainly formed of the tungsten, on the semiconductor substrate; and forming an oxide film on an exposed surface of the first layer by plasma processing at a process temperature of 300° C. or more using a process gas containing oxygen gas and hydrogen gas at a flow rate ratio (hydrogen gas flow rate/oxygen gas flow rate) of the hydrogen gas to the oxygen gas of 2 or more and 4 or less.

Another embodiment of the present invention is a method for plasma oxidation of a film of a component different from a film mainly formed of tungsten of a semiconductor substrate on which the film mainly formed of the tungsten and the film of the component different from the film mainly formed of the tungsten are formed, comprising forming an oxide film on an exposed surface of the film of the component different from the film mainly formed of the tungsten by plasma processing at a process temperature of 300° C. or more using a process gas containing oxygen gas and hydrogen gas at a flow rate ratio (hydrogen gas flow rate/oxygen gas flow rate) of the hydrogen gas to the oxygen gas of 2 or more and 4 or less.

The present invention can be applied to the forming of a gate electrode of a transistor, and performs plasma oxidation of side surfaces of the gate electrode.

BRIEF DESCRIPTION OF THE DRAWINGS

FIG. 2A and FIG. 2B are diagrams schematically showing states that an oxide film is selectively formed on a gate electrode according to the present invention.

FIG. 3A and FIG. 3B are diagrams schematically showing states of a gate electrode having an oxide film formed on side surfaces of a laminated gate electrode.

FIG. 4A and FIG. 4B are graphs showing a change in oxidation of a tungsten layer by plasma oxidation.

BEST MODE FOR IMPLEMENTING THE INVENTION

Figure 1:
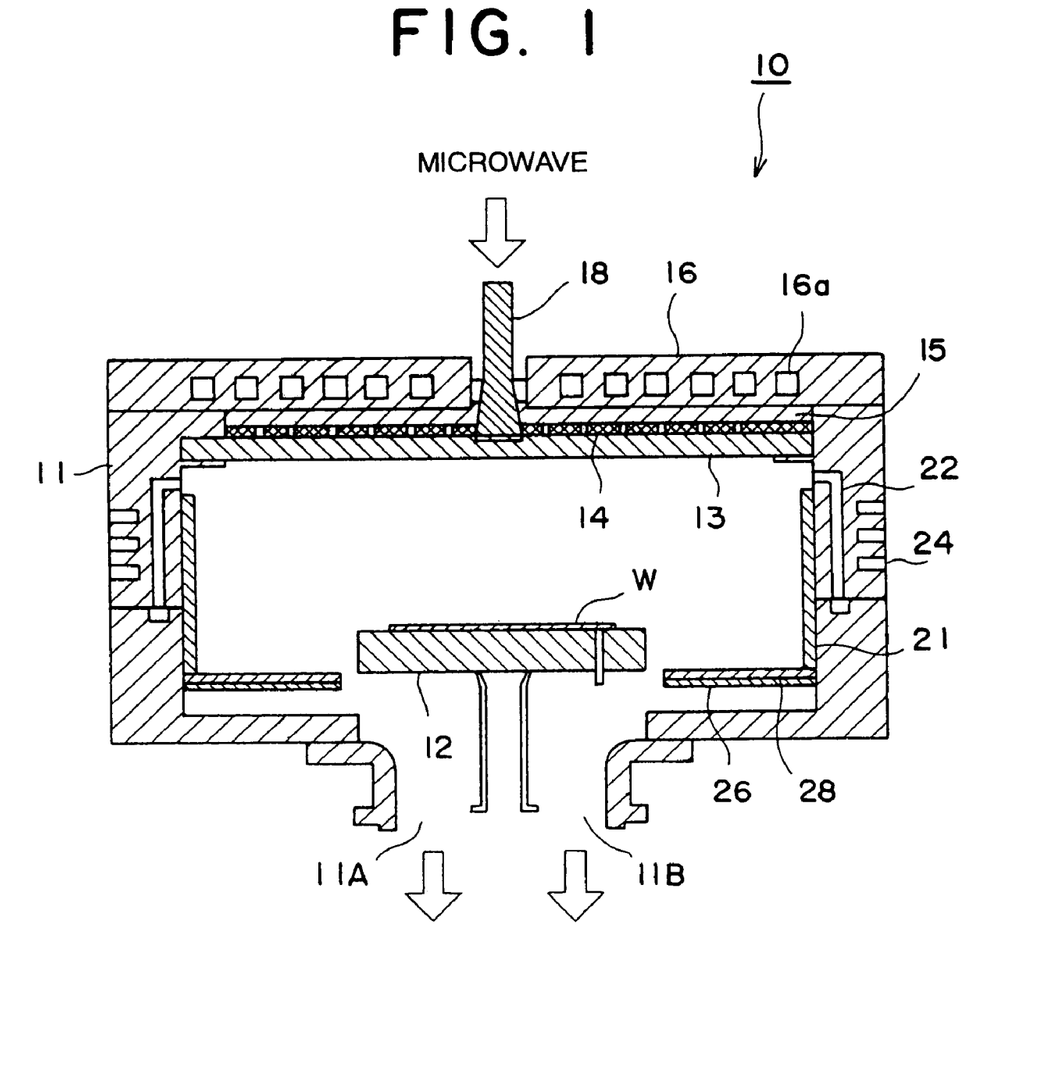
FIG. 1 is a schematic view (sectional view) showing an example of the structure of a plasma processing apparatus according to the present invention.

Embodiments the present invention will be described in details with reference to the figures. FIG. 1 shows an example of a schematic structure of a plasma processing apparatus 10 according to an embodiment of the present invention. The plasma processing apparatus 10 has a processing chamber 11 which is provided with a substrate support table 12 for supporting a silicon wafer W as a substrate to be processed. The gas in the processing chamber 11 is exhausted through exhaust ports 11A and 11B by an unshown exhaust pump. The substrate support table 12 has a heater function for heating the silicon wafer W. A gas baffle plate (partition plate) 26 of aluminum is disposed around the substrate support table 12. A quartz cover 28 is disposed on the top surface of the gas baffle plate 26.

An opening is formed at an upper part of the processing chamber 11 in correspondence with the silicon wafer W on the substrate support table 12. This opening is closed by a dielectric plate 13 of quartz or $Al_2O_3$. A plane antenna 14 is disposed above (outside of the processing chamber 11) the dielectric plate 13. The plane antenna 14 has plural slots for passage of an electromagnetic wave supplied from a wave guide. A wavelength shortening plate 15 and a wave guide 18 are disposed further above (outside) the plane antenna 14. A cooling plate 16 is disposed on the exterior of the processing chamber 11 to cover the top of the wavelength shortening plate 15. Refrigerant passages 16a where a refrigerant flows are formed within the cooling plate 16.

A gas supply port 22 for introduction of gas at the time of the plasma processing is disposed in the inner side wall of the processing chamber 11. The gas supply port 22 may be provided for each of gases to be introduced. In such a case, an unshown massflow controller is disposed as flow rate control means for the individual supply ports. Meanwhile, the gases to be introduced may be previously mixed, so that the supply port 22 may be a single nozzle. In this case, it is not shown but the flow rate of the gas to be introduced is adjusted by a flow rate control valve or the like in a mixing stage. And, refrigerant passages 24 are formed in the inner wall of the processing chamber 11 to surround the chamber as a whole.

The plasma processing apparatus 10 is provided with an electromagnetic wave generator (not shown) which generates an electromagnetic wave of several gigahertzes for plasma excitation. A microwave generated by the electromagnetic wave generator is introduced into the processing chamber 11 by propagation via the wave guide 18.

In a case where a gate electrode of a semiconductor device is formed, a well region is first formed on a silicon wafer. A gate oxide film is formed on the silicon wafer by plasma oxidation or thermal oxidation. Then, a polysilicon film is formed by CVD. In order to decrease the resistance of the gate electrode, a refractory electrode material having a resistivity smaller than that of polysilicon is laminated on the polysilicon to form a laminated gate electrode. For the refractory electrode material, for example, tungsten can be used. Side surfaces of the gate electrode are subjected to wet etching.

The exposed side surfaces and lower part of the laminated gate electrode cause defects such as an increase of a leak current due to electric field concentration if they are as they are. Therefore, an insulating film is formed on the side surfaces and the lower part of the gate electrode by plasma processing according to the present invention. In other words, the silicon wafer W which has the side surfaces of the gate insulating film etched is set in the processing chamber 11 of the plasma processing device 10. Then, air in the processing chamber 11 is exhausted through the exhaust ports 11A, 11B to set a predetermined processing pressure in the interior of the processing chamber 11. Then, an rare gas, oxygen gas and hydrogen gas are supplied through the gas supply port 22.

Meanwhile, a microwave having a frequency of several GHz generated by the electromagnetic wave generator is supplied to the processing chamber 11 through the wave guide 18. The microwave is introduced into the processing chamber 11 through the plane antenna 14 and the dielectric plate 13. Plasma is excited by the microwave, and a radical is generated. The high-density plasma generated by microwave excitation within the processing chamber 11 causes the silicon wafer W to form an oxide film.

As described above, oxidation of tungsten starts quickly when the temperature exceeds about 300° C., and oxidation of WSi starts rapidly when the temperature exceeds 400° C. In this embodiment, oxygen gas and hydrogen gas are introduced at the same time to control a reducing property of the atmosphere, so that only silicon can be oxidized selectively while preventing the tungsten from being oxidized even at 300° C. or more.

The same is also applied to refractory electrode materials other than the tungsten.

Examples

Examples of the present invention will be described with reference to a gate electrode which is formed on a MOS transistor of a semiconductor device.

Figure 2A:
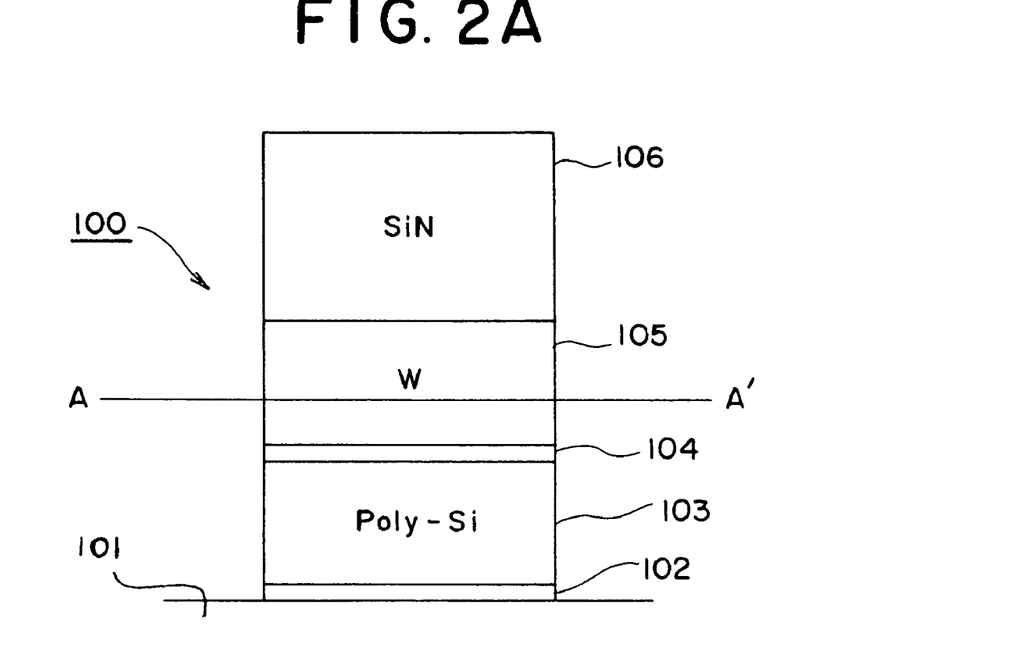
FIG. 2A shows a state before plasma oxidation.
Figure 2B:
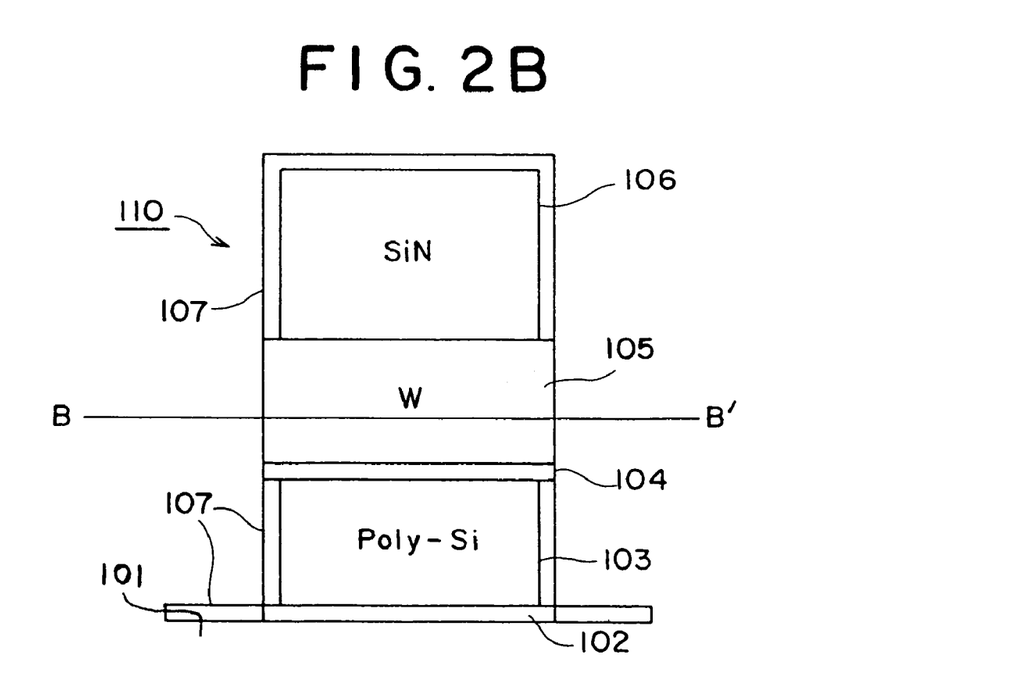
FIG. 2B shows a state after the plasma oxidation.

FIG. 2A and FIG. 2B show schematically states that an oxide film is selectively formed on a gate electrode according to an embodiment of the present invention. FIG. 2A shows an etched gate electrode 100. 101 denotes a silicon wafer W. The silicon wafer 101 has a well region formed with $P^+$ or $N^+$ doped. A gate oxide film 102 is formed on the silicon wafer 101 by thermal oxidation processing. A polysilicon film is formed on the gate oxide film 102 by CVD to form a polysilicon electrode layer 103 (first electrode layer). To decrease a specific resistance of the gate electrode 100, for example, a tungsten layer 105 (second electrode layer) is formed as a refractory electrode material on the polysilicon by sputtering. A conductive barrier layer 104 is formed on the polysilicon electrode layer 103 before the tungsten layer 105 is formed in order to prevent its interface from being silicided. In this case, tungsten nitride is used for the barrier layer 104. A silicon nitride layer 106 which also serves as an etching mask is formed on the top of the tungsten layer 105.

Then, etching is performed with the silicon nitride layer 106 used as the etching mask to form the gate electrode 100. At this time, the gate oxide film 102 (insulating film) is etched to expose the side surfaces and lower part of the gate electrode 100.

The exposed side surfaces and lower part of the gate electrode 100 is subjected to plasma oxidation by the plasma processing apparatus 10. Thus, an oxide insulating film 107 is selectively formed on the surfaces of the silicon wafer 101, the polysilicon layer 103 and the silicon nitride layer 106 to form a gate electrode 110 as shown in FIG. 2B. At this time, the oxide film is not formed on the tungsten layer 105 and the barrier layer 104.

Instead of the tungsten layer 105, another high melting point electrode material, for example, molybdenum, tantalum, titanium, their silicides and alloys, and the like can be adopted.

Figure 3A:
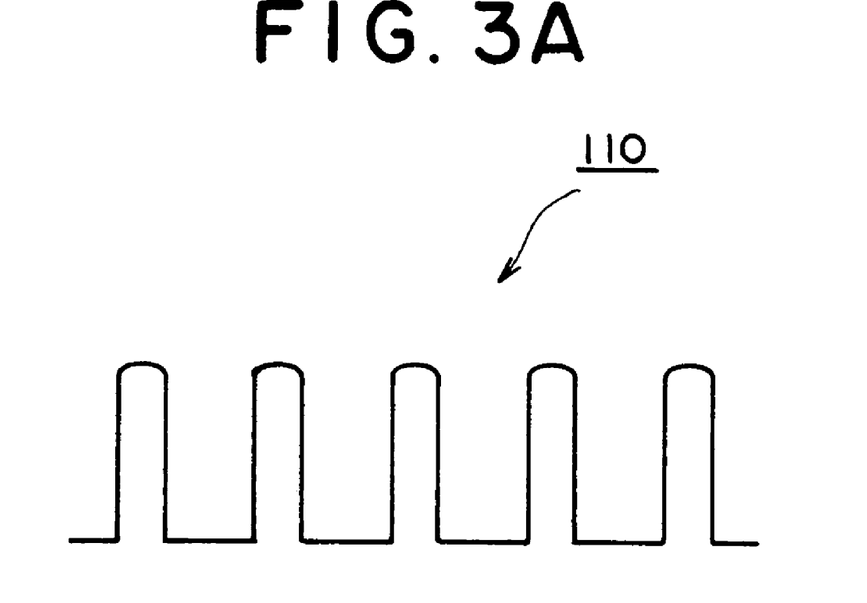
FIG. 3A shows a gate electrode undergone plasma oxidation.
Figure 3B:
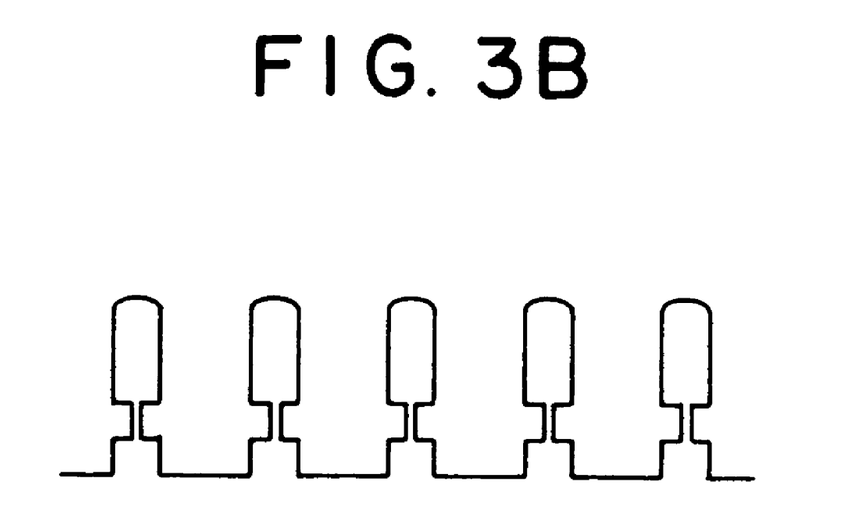
FIG. 3B shows a gate electrode undergone oxidation at a high temperature illustrated for comparison.

FIG. 3A shows the gate electrode 110 having an oxide film formed on the side surfaces of the gate electrode of a MOS transistor by the plasma processing of this embodiment. This laminated gate electrode has a thickness of 250 nm from the polysilicon layer 103 to the silicon nitride layer 106. At this time, a silicon substrate temperature is 250° C., and a processing time is 50 seconds. FIG. 3B shows a gate electrode undergone thermal oxidation by only oxygen gas for comparison. At this time, the silicon substrate temperature is 400° C., and the processing time is 110 seconds. It is apparent from the figure that tungsten is dispersed (missing) because the process temperature of the thermal oxidation by only oxygen gas is high. There is also a possibility that the substrate is contaminated by the dispersion of tungsten. In this embodiment, such a phenomenon is not observed even by the oxidation at the silicon substrate temperature of 500° C.

Figure 4A:
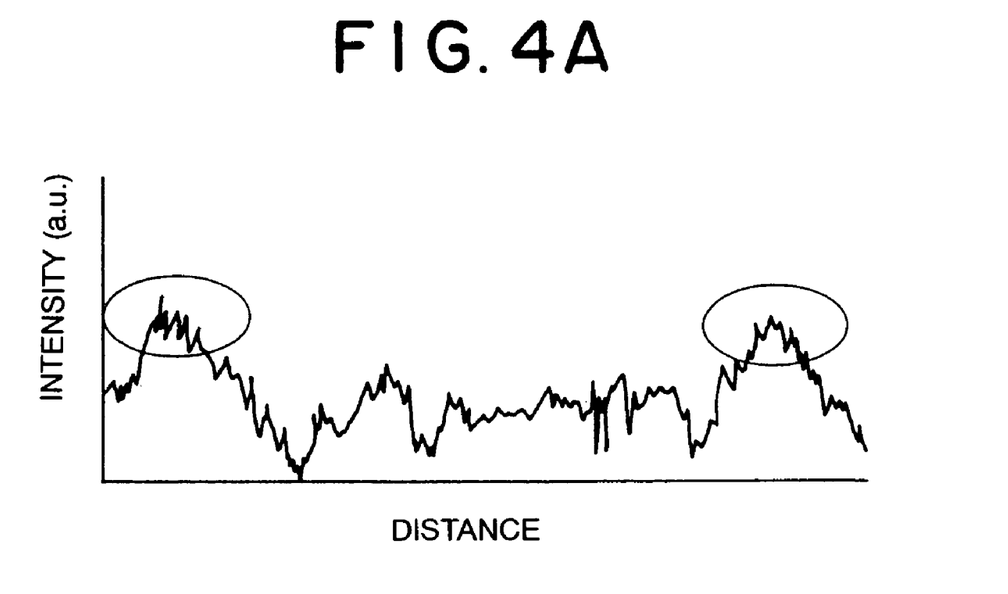
FIG. 4A shows a state of an oxygen line profile before plasma processing.
Figure 4B:
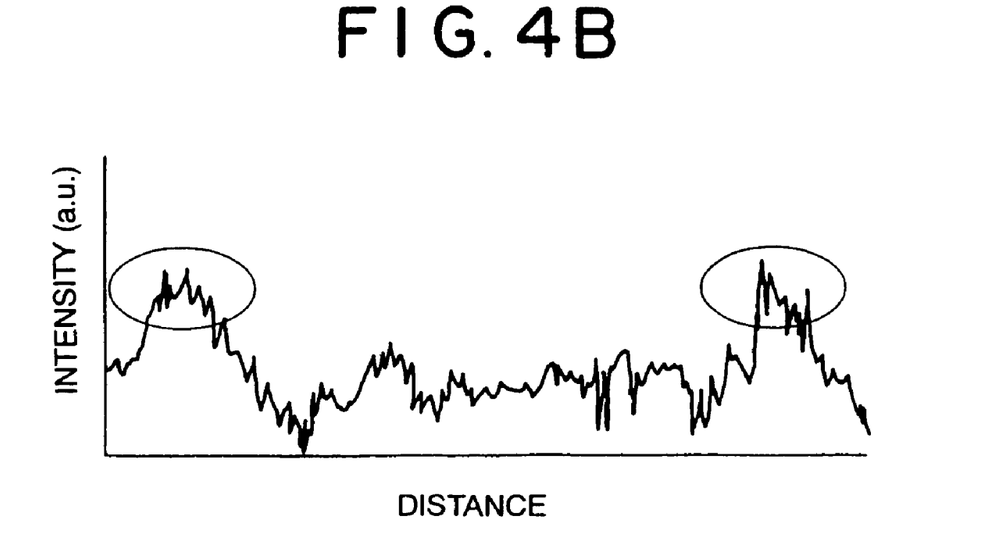
FIG. 4B shows a state of the oxygen line profile after the plasma processing.

FIG. 4A and FIG. 4B show changes in oxidation of the tungsten layer 105 by plasma oxidation. The plasma oxidation was performed at 500° C. for 50 seconds. An oxygen line profile is measured by EELS (Electron Energy Loss Spectroscopy). FIG. 4A shows a state of the oxygen line profile before the plasma processing. The tungsten layer 105 taken along line A-A' of FIG. 2A is observed. FIG. 4B shows a state of the oxygen line profile after the plasma processing. The tungsten layer 105 taken along line B-B' of FIG. 2B is observed. The vertical axis represents a luminescence intensity proportional to an amount of oxygen. The horizontal axis represents a length of the A-A' cross section or the B-B' cross section by a standardized numerical value. It is seen from the results that the oxide film of the tungsten layer 105 has substantially no change before and after the plasma oxidation, and the oxidation of the tungsten layer 105 is quite little.

For the gate electrode of the semiconductor device according to this embodiment, the oxide film thickness on the side surface of the polysilicon layer 103 before and after the plasma oxidation was observed by TEM. As a result, the oxide film thickness on the side surface of the gate electrode undergone the etching and wet cleaning was about 2.0 nm, while the oxide film thickness of the side surface of the gate electrode after the plasma oxidation was about 3.3 nm. In other words, the oxide film was firmly and selectively formed on the polysilicon layer by this embodiment.

It is seen from the above results that the oxide film is selectively formed on the polysilicon layer by this embodiment, but the oxide film is not additionally formed on the tungsten layer. And, the formation of the oxide film can be controlled according to conditions such as time, a process temperature and the like.

Hydrogen gas is added when the plasma oxidation is performed on the exposed side surface of the gate electrode 100 of the MOS transistor by the plasma processing apparatus 10. Thus, a reduction atmosphere is formed at the time of radical oxidation, and the selectivity of oxidization of only polysilicon without oxidizing tungsten is improved.

Figure 5:
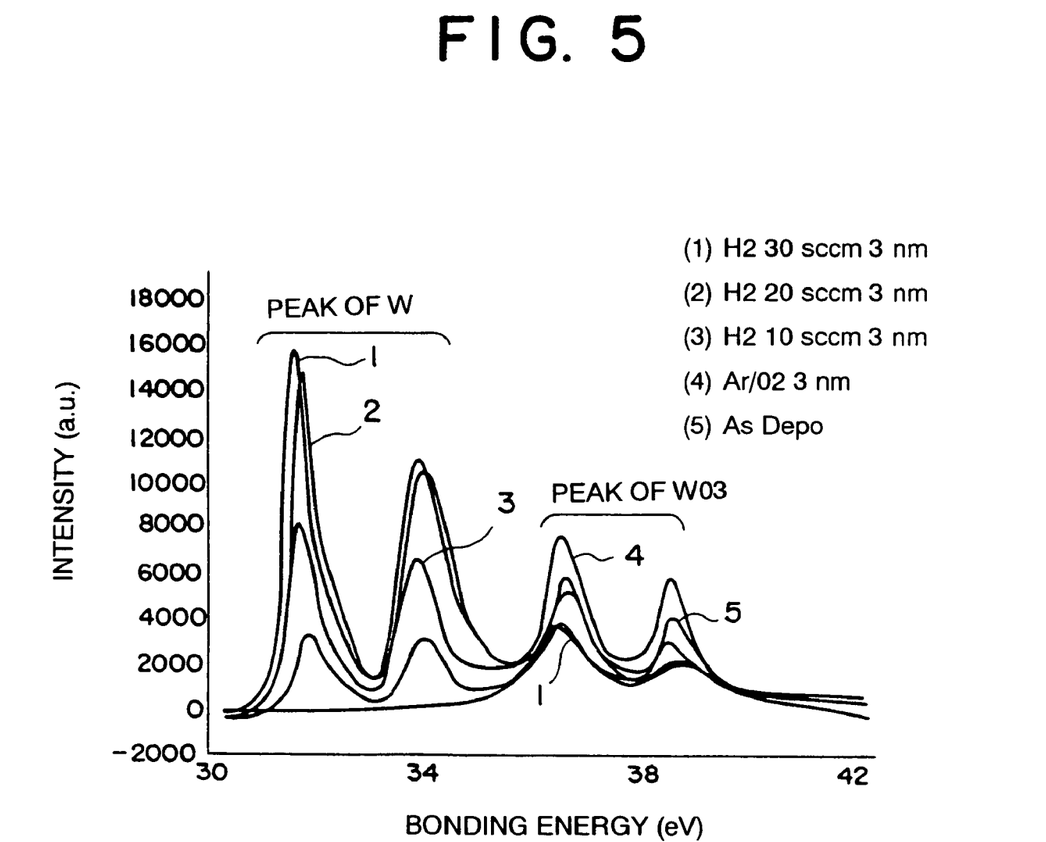
FIG. 5 is a graph showing levels of oxidation of tungsten when hydrogen gas is introduced and when its flow rate is varied.

FIG. 5 shows oxidized levels of tungsten indicated by surface analysis made by an XPS analyzer when the hydrogen gas is introduced and when its flow rate is varied. The vertical axis represents peak intensity of W and $WO_3$, and the horizontal axis represents a bonding energy. In the figure, (1), (2) and (3) indicate cases that hydrogen gas is introduced at flow rates of 30, 20, 10 sccm. For comparison, (4) indicates a case that only argon and oxygen are used, and (5) indicates a case that W is not processed (oxidation). (1), (2), (3), and (4) have the same oxide film thickness of 3 nm on the Si substrate. It is apparent from the results that intensity around 31 to 34 indicating the peaks of tungsten are higher as the flow rate of hydrogen gas is larger. Meanwhile, intensity around 35 to 39 indicating the peaks of tungsten oxide are higher when the processing is performed without hydrogen gas as indicated by (4) or (5). Thus, it is seen that the tungsten is hardly oxidized when the hydrogen gas becomes larger at a flow rate ratio with respect to the oxygen gas by introducing the hydrogen gas.

Figure 6:
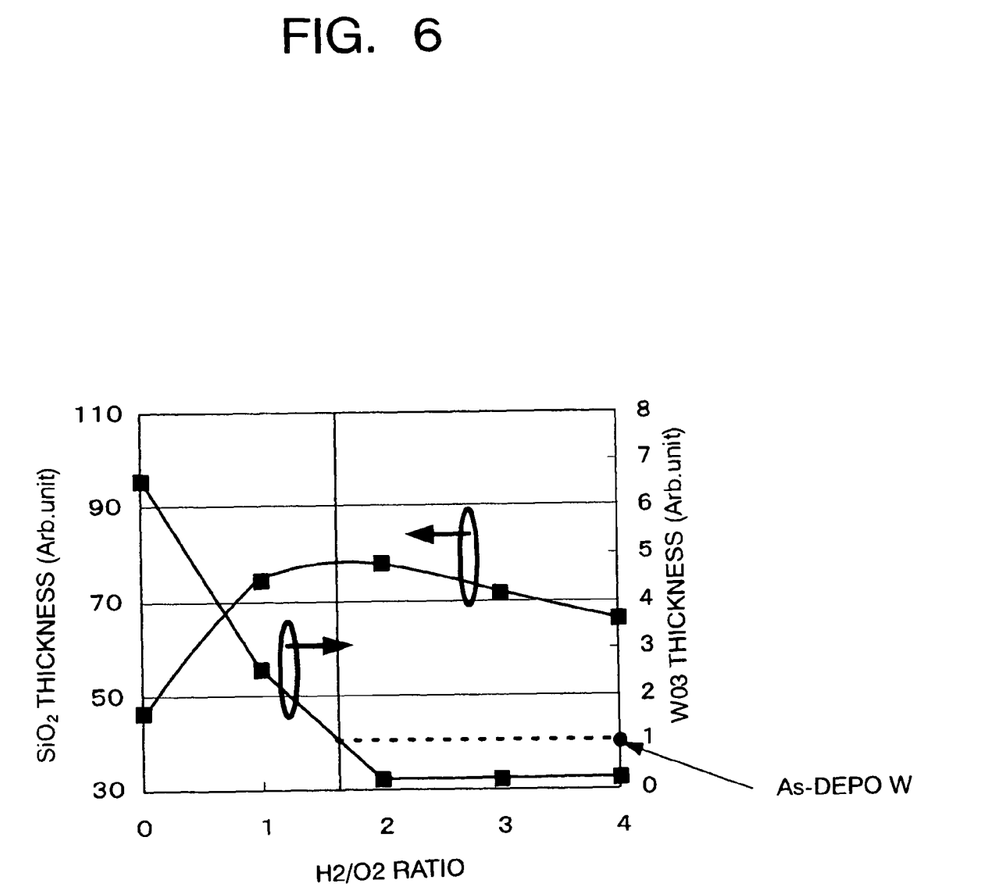
FIG. 6 is a graph showing a state that a thickness of a silicon oxide film and a thickness of a tungsten oxide film, which are formed by the plasma oxidation, are variable depending on a flow rate ratio of hydrogen gas and oxygen gas.

FIG. 6 shows the results of measurement of the thicknesses of silicon oxide and tungsten oxide films formed with the flow rate ratio of hydrogen gas and oxygen gas varied. The vertical axis represents the thicknesses of the silicon oxide film and the tungsten oxide film formed by the same processing time, and the horizontal axis represents a ratio between a hydrogen gas flow rate and an oxygen gas flow rate. It is seen that the oxidation rate of silicon becomes maximum when a ratio of the hydrogen gas is 1 to 2, the oxide film thickness of the tungsten decreases by introducing the hydrogen gas, and tungsten oxide is substantially not formed when the flow rate ratio is 2 or more. The substrate has a temperature of 250° C. when processing in this example, the oxygen gas flow rate is 100 SCCM, the pressure is 6.7 Pa, and power supplied to plasma is 2.2 KW.

It is seen from FIG. 5 and FIG. 6 that oxidation of the tungsten can be suppressed by introduction of the hydrogen gas, and the selective oxidation of silicon only can be controlled by controlling the flow rate ratio with respect to the oxygen gas. To suppress the oxidation of tungsten, a gas flow rate ratio is preferably 1.5 or more, and more preferably 2 or more, and a gas flow rate ratio more desirable than the oxidation rate of silicon is 0.5 or more and 4 or less. Therefore, a ratio between a hydrogen gas flow rate and an oxygen gas flow rate is desirably 1.5 or more, and more desirably 2 or more and 4 or less.

Figure 7:
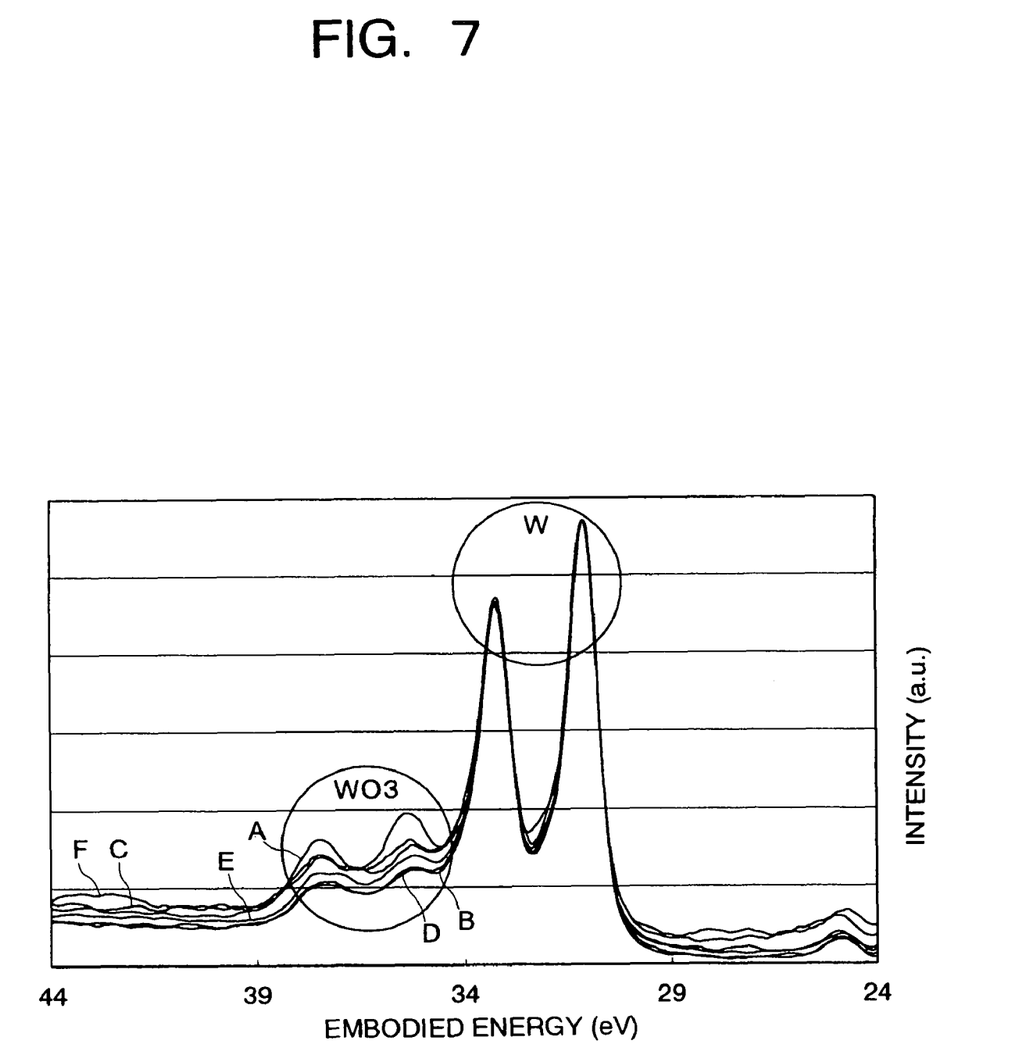
FIG. 7 is a graph showing changes of peaks indicating tungsten and tungsten oxide depending on a process temperature.

FIG. 7 shows oxidized levels of tungsten by the same surface analysis made by the XPS analyzer as FIG. 5 when processing is performed for oxidization of 8 nm on a surface of a silicon substrate at varying temperatures. An $Ar/H_2/O_2$ flow rate is 1000/200/100 SCCM, a pressure is 8.0 Pa, and power supplied to plasma is 2.2 kW. It is apparent from the results that peak intensity of $WO_3$ having the tungsten oxidized is highest at the time of As-depo indicated by curve A, and tungsten oxide, which is formed by natural oxidation on the surface at the time of depo or after the depo by the plasma processing that introduces hydrogen gas and oxygen gas, is reduced. In the same figure, curves B, C, D, E and F indicate cases of temperatures of 250° C., 300° C., 350° C., 400° C. and 600° C., respectively. According to the present invention, it is seen that oxidation of tungsten does not progress even at 600° C. that is higher than a temperature of 300° C. or more at which the tungsten is oxidized rapidly.

Figure 8:
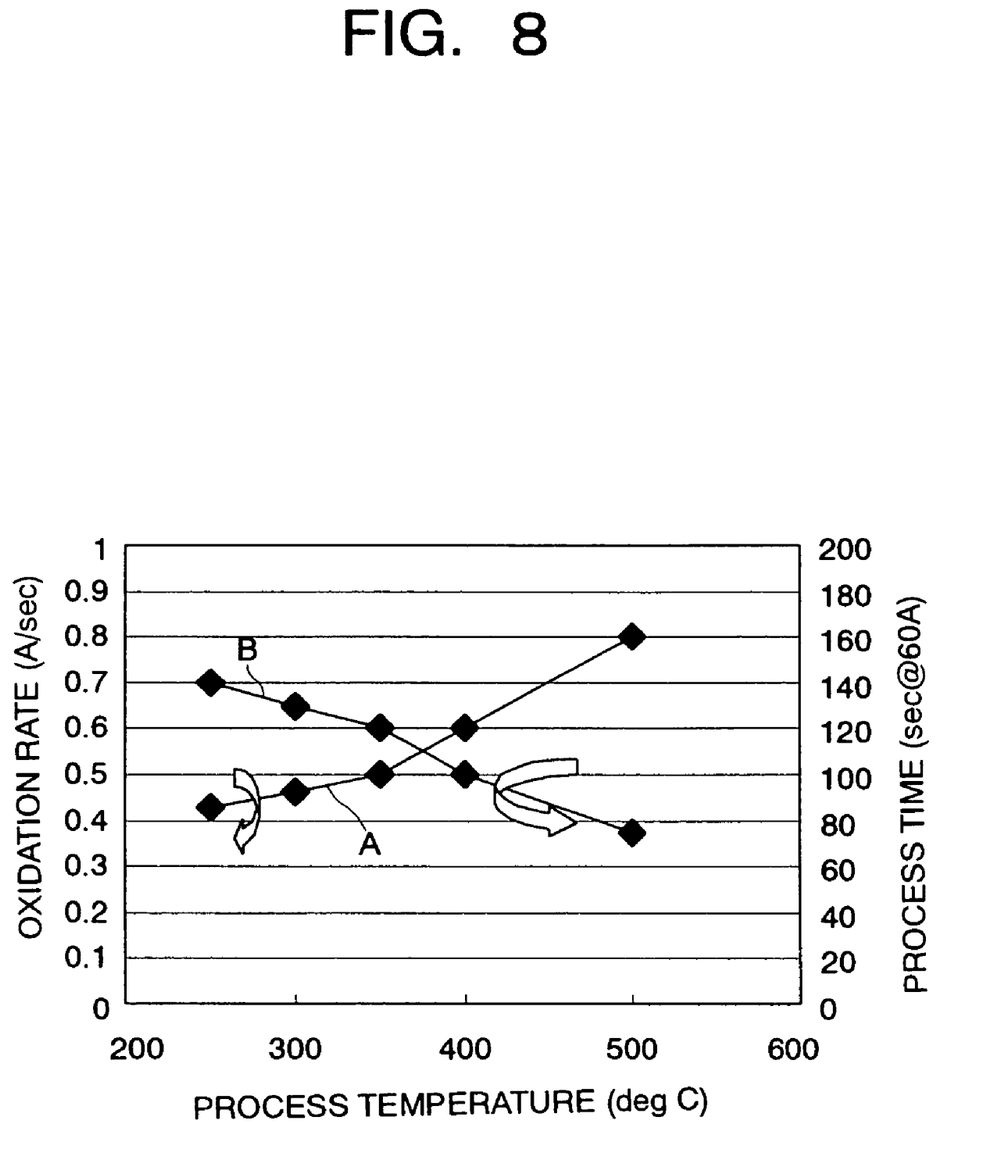
FIG. 8 is a graph showing an oxidation rate and a necessary processing time when 6 nm of a silicon oxide film is formed by plasma oxidation with a process temperature varied.

FIG. 8 shows an oxidation rate and an oxidization time of silicon plotted with respect to a substrate temperature when a surface of a silicon substrate is oxidized for 6 nm. The gas flow rates of $Ar/H_2/O_2$ at the time of processing in this example are 1000/200/100 SCCM, a pressure is 6.7 Pa, and power supplied to plasma is 2.2 KW. It is seen from the figure that the processing at 500° C. has an oxidation rate about two times faster in comparison with the processing at a substrate temperature of 250° C., and when the same oxidation amount is required, it can be attained in a shorter processing time when the temperature is higher. As described above, where the oxide film is formed on silicon, excellent film quality can be obtained at a higher temperature, and a difference in oxidation rate caused depending on a pattern density is decreased. Therefore, it is desirable that the process temperature is 300° C. or more.

The embodiments and examples of the present invention were described with reference to some examples, which do not limit the present invention, and various modifications may be made within the technical scope of the invention as set forth in the claims. For example, the gate electrode formed of laminated polysilicon and tungsten was described above, but it may be formed of a single layer of tungsten, another high melting point electrode material or a silicide thereof. And, it can also be applied to portions other than the gate electrode of the transistor and can be applied to manufacturing of various semiconductors that require selective oxidation of a layer containing silicon, e.g., a layer of polysilicon or the like, while suppressing oxidation of a metal layer other than the tungsten layer.

As described above, the surface of the gate electrode and the like is oxidized by the plasma processing, so that it becomes possible to selectively oxidize the other layer of polysilicon or the like without oxidizing the tungsten or tungsten silicide layer.

INDUSTRIAL APPLICABILITY

The method for manufacturing a semiconductor device and the plasma oxidation method according to the present invention can be used in the semiconductor manufacturing industry and the like that manufacture semiconductor devices. Therefore, the present invention has industrial applicability.

What is claimed is:

1. A method for manufacturing a prescribed semiconductor device by forming a film mainly formed of tungsten and a film of silicon on a semiconductor substrate, comprising:
   forming a first layer, which is formed of the film of the silicon, on the semiconductor substrate;
   forming a second layer, which is formed of the film mainly formed of the tungsten, on the semiconductor substrate; and
   selectively forming an oxide film on an exposed surface of the first layer by plasma processing at a process temperature of 300° C. or more using a process gas consisting of Ar, $O_2$ gas, and $H_2$ gas at a flow rate ratio of the $H_2$ gas to the $O_2$ gas of 2 or more and 4 or less so as not to form the oxide film on an exposed surface of the second layer.

2. The method for manufacturing a semiconductor device according to claim 1, wherein the semiconductor device is a transistor, and a gate electrode is formed of the first layer and the second layer.

3. The method for manufacturing a semiconductor device according to claim 1, wherein the second layer is a tungsten layer or a tungsten silicide layer.

4. A method for plasma oxidation of a film of silicon of a semiconductor substrate, on which a film mainly formed of tungsten is formed on the film of silicon, comprising:
   selectively forming an oxide film on an exposed surface of the film of silicon by plasma processing at a process temperature of 300° C. or more using a process gas consisting of Ar gas, $O_2$ gas and $H_2$ gas at a flow rate ratio of the $H_2$ gas to the $O_2$ gas of 2 or more and 4 or less so as not to form the oxide film on an exposed surface of the film mainly formed of tungsten.

5. The plasma oxidation method according to claim 4, wherein the plasma is excited by a microwave.

6. The plasma oxidation method according to claim 1, wherein the first layer is a polysilicon layer.

7. A method for plasma processing, in a processing chamber, of a substrate including a high melting point metallic member and a film containing silicon, comprising:
   supplying a process gas consisting of Ar gas, $O_2$ gas and $H_2$ gas into the processing chamber at a flow rate ratio of the $H_2$ gas to the $O_2$ gas of 2 or more and 4 or less to generate a plasma of said process gas consisting of Ar gas, $O_2$ gas and $H_2$ gas directly on the substrate in the processing chamber; and
   selectively oxidizing the film containing the silicon using the plasma of said process gas consisting of Ar gas, $O_2$ gas and $H_2$ gas to form an oxide film at a process temperature of 300° C. or more so as not to oxidize the high melting point metallic member.

* * * * *